United States Patent
Moreira et al.

(10) Patent No.: US 9,590,575 B2
(45) Date of Patent: Mar. 7, 2017

(54) AMPLIFIER STAGE

(71) Applicant: Intel Mobile Communications GmbH, Neubiberg (DE)

(72) Inventors: José Moreira, Munich (DE); Stephan Leuschner, Munich (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 388 days.

(21) Appl. No.: 13/773,852

(22) Filed: Feb. 22, 2013

(65) Prior Publication Data

US 2014/0240045 A1    Aug. 28, 2014

(51) Int. Cl.
*H03F 3/45* (2006.01)
*H03F 1/02* (2006.01)

(52) U.S. Cl.
CPC ....... *H03F 3/45071* (2013.01); *H03F 1/0261* (2013.01); *H03F 3/45183* (2013.01)

(58) Field of Classification Search
CPC .......................................................... H03F 3/45
USPC ................................ 330/261, 253, 260, 254
See application file for complete search history.

(56) References Cited

U.S. PATENT DOCUMENTS

| | | | | |
|---|---|---|---|---|
| 4,490,682 A * | 12/1984 | Poulo | ................................ | 330/9 |
| 4,812,780 A * | 3/1989 | Zimmerman | ................. | 330/253 |
| 5,481,224 A * | 1/1996 | Kimura | ........................ | 330/253 |
| 5,691,658 A * | 11/1997 | Klein | ..................... | H03F 3/265 |
| | | | | 327/104 |
| 5,877,612 A * | 3/1999 | Straw | ........................... | 330/254 |
| 5,886,578 A * | 3/1999 | Miyashita et al. | ............ | 330/253 |
| 7,259,626 B2 * | 8/2007 | Zolfaghari | .............. | H03F 1/301 |
| | | | | 330/253 |
| 7,795,980 B2 * | 9/2010 | Griffiths | ................ | H03F 1/0272 |
| | | | | 330/288 |
| 2014/0035669 A1 | 2/2014 | Moreira | | |

OTHER PUBLICATIONS

A. Zohny, "Analog Linearization Proposal" in Linearization for CMOS PA, Sep. 22, 2011, pp. 1-32, Friedrich-Alexander-Universität Erlangen-Nürnberg.

* cited by examiner

*Primary Examiner* — Henry Choe
(74) *Attorney, Agent, or Firm* — Viering, Jentschura & Partner mbB

(57) ABSTRACT

A differential amplifier stage may include: a first transistor having a gate terminal; a second transistor having a gate terminal; and a voltage limiting circuit coupled to the gate terminals of the first and second transistors, wherein the voltage limiting circuit limits a gate voltage supplied to at least one of the gate terminals of the first and second transistors.

27 Claims, 7 Drawing Sheets

AMPLIFIER STAGE

TECHNICAL FIELD

Various aspects relate to an amplifier stage, for example of a power amplifier.

BACKGROUND

Robustness of the transistors to voltage stress, output power, and/or efficiency may be relevant parameters in the design of amplifiers such as, e.g., power amplifiers (PA). The required output power may need to be achieved without overstressing the transistors, in order to keep their characteristics unchanged during the desired product lifetime. This should be done while maximizing the PA efficiency, which is the ratio of the output power to the power consumption. Negative effects of high power consumption may be low battery lifetime and/or high self-heating of the PA.

Other relevant parameters for the PA performance may be saturation power (Psat) and sharpness of the transition from linear operation to saturation (in the AM/AM (amplitude-to-amplitude modulation) characteristic). High Psat and sharp transitions may make it easier to obtain low ACLR (Adjacent Channel Leakage Power Ratio) and low EVM (Error Vector Magnitude) of the transmitted signal. Unfortunately, CMOS (Complementary Metal Oxide Semiconductor) PAs usually show relatively smooth transitions.

While too high voltage stress may lead to device degradation or even to total failure, not using the full voltage stress capability of the transistors normally hinders the maximization of Psat and of the efficiency. Unfortunately this may often be the case, since the circuits may need to be designed with enough headroom, taking into account the variations over process, voltage and temperature (PVT), in order to prevent overstress under worst case conditions.

Dynamic biasing techniques may be used in order to sharpen the relatively smooth transition from linear operation to saturation of CMOS PAs and even to increase Psat.

Higher input voltage stress can be endured by using more robust transistors (thick oxide gate) at the input of the PA output stage. However, PA performance may decrease significantly since thick oxide transistors are typically slower than thin oxide transistors.

Relatively low variation of the input voltage over PVT may be accomplished by a voltage-mode driving circuit whose output voltage saturates to a well-controlled value. This technique has the disadvantage of the (CMOS) driving circuit also having a smooth transition from linear operation to saturation, which may add to the one of the output stage.

It may thus be desirable to maximize the input voltage of an amplifier stage, e.g. an amplifier output stage such as, e.g., a CMOS PA output stage, while preventing overstress under worst case conditions and considering the requirement of a sharp transition from linear operation to saturation.

SUMMARY

A differential amplifier stage may be provided, which may include: a first transistor having a gate terminal; a second transistor having a gate terminal; a voltage limiting circuit coupled to the gate terminals of the first and second transistors, wherein the voltage limiting circuit limits a gate voltage supplied to at least one of the gate terminals of the first and second transistors.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
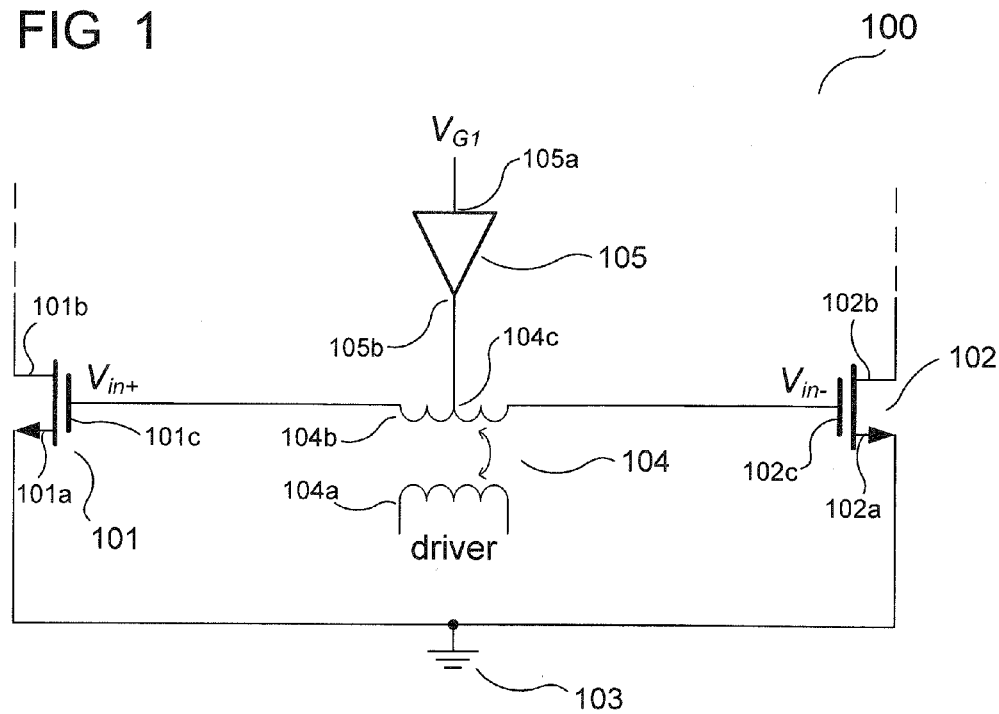
FIG. 1 shows an example of a power amplifier output stage.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature. That is, the terms "coupled" or "connected" may include a direct "coupling" or "connection" as well as an indirect "coupling" or "connection".

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

In one or more aspects, the present disclosure describes a concept to maximize the input voltage of an amplifier stage, e.g. an amplifier output stage, e.g. a PA output stage such as, e.g., a CMOS PA output stage, while preventing overstress under worst case conditions and considering the requirement of sharp transition from linear operation to saturation. For example, by means of the concept described herein it may be possible to operate one or more transistors of an amplifier (e.g. input transistors of an amplifier output stage) closer to their maximum possible value.

In one or more aspects, the present disclosure relates to differential amplifier topologies, e.g. differential PA topologies, though the concept described herein may be applied to single-ended amplifier topologies as well. As an example, PA output stages are considered where the input transistors of the PA output stage are CMOS transistors in common-source connection, while the rest of the output stage may be designed arbitrarily. However, the concept described herein may not be limited to the aforementioned amplifier architecture.

In accordance with one or more aspects, the present disclosure describes a voltage limiting circuit that may be coupled to the gate terminal of at least one transistor (e.g. input transistor) of an amplifier stage, e.g. to first and second (e.g. input) transistors of a differential amplifier stage, and may be configured to limit a gate voltage (e.g. clip negative and/or positive peaks of the gate voltage) that is supplied to the gate terminal of the at least one transistor, or supplied to at least one of the gate terminals of the first and second transistors, e.g. an input voltage supplied to at least one of the gate terminals of the input transistors of a differential amplifier stage. In other words, the voltage limiting circuit may be configured to prevent that the gate voltage, e.g. input voltage of an amplifier stage, exceeds a predetermined upper threshold (e.g. a maximum tolerable value for the input transistor(s) of the amplifier stage) and/or falls below a predetermined lower threshold (e.g. minimum tolerable value for the input transistor(s) of the amplifier stage).

In accordance with one or more aspects, optimization of the input voltage of an amplifier stage (e.g. PA output stage), under the limits imposed by reliable operation, and protection of the input transistors against overstress may be accomplished by adding one or more voltage limiters to the inputs of the amplifier stage (e.g. PA output stage). The limiters may be configured to clip absolute voltage values above the maximum allowed for reliable operation. For example, the one or more voltage limiters may be configured to clip voltages above a maximum positive value allowed for reliable operation. Alternatively or in addition, the one or more voltage limiters may be configured to clip voltages below a maximum negative value allowed for reliable operation. Accordingly, there may be no need to include any headroom for PVT (except for, e.g., the tolerance of the limiter itself, which may be made much lower than the one of a linear driving circuit) and the transistors may operate with maximum input voltage under all PVT conditions.

The voltage limiters may also be referred to herein as clipping elements, or voltage clipping elements.

The voltage limiting circuit, or the one or more voltage limiters, may include or may be unipolar devices, for example field effect transistors, e.g. MOS field effect transistors, that may, for example, be coupled between the gate terminal of the at least one transistor (e.g. input transistor) of the amplifier stage and a power supply potential (e.g. lower supply potential, e.g. VSS or ground potential), or e.g. between the gate terminal of a first transistors (e.g. first input transistor) and second transistor (e.g. second input transistor) of the (differential) amplifier stage.

By suitable arrangement of the limiters, it may also be possible to include a dynamic biasing function, in order to increase Psat and/or sharpen the transition from linear operation to saturation. "Dynamic biasing" may, for example, include or refer to shifting the biasing point of a transistor (e.g. of an input transistor of an amplifier stage, e.g. of amplifier output stage), e.g. upward shifting of the biasing point (in other words, shifting the biasing point to a higher value).

The following examples will be mainly described in connection with CMOS topology, i.e. transistors of the amplifier stage or amplifier may be configured as NMOS or PMOS transistors. However, it is to be understood that other types of transistors, e.g. other types of (n-type and/or p-type) field-effect transistors, may be used instead of MOS transistors. Thus, when, for example, referring to a gate oxide in the following, it may be understood that other types of gate dielectrics may be used as well.

Furthermore, the following examples will be mainly described in connection with PA output stages. However, it is to be understood that the concept of the present disclosure may not be limited to PA output stages, but may, for example, be applied to any amplifier or amplifier stage, in which (input) voltage limiting and/or dynamic biasing may be desirable.

Application fields for amplifier stages or architectures described herein may include, but may not be limited, to e.g. mobile communication devices, line driver amplifiers, or wireline communication amplifiers.

FIG. 1 shows, in a view 100, an example of a PA output stage with differential topology having CMOS (more particularly, NMOS in the example shown) input transistors 101, 102 in common-source connection. That is, a first source/drain terminal 101a (e.g. source terminal) of a first input transistor 101 and a first source/drain terminal 102a (e.g. source terminal) of a second input transistor 102 are electrically coupled to a common node, which is coupled to a lower supply potential 103, e.g. a VSS or ground potential of the PA. As an explanatory example, driving is made through a transformer 104 including a primary 104a (e.g. primary winding or coil) and a secondary 104b (e.g. secondary winding or coil), biasing of the input transistors 101, 102 is brought through a center tap 104c of the secondary 104b, and a (linear) driving circuit ("driver") is connected to the primary 104a. In particular, the secondary 104b (e.g. secondary winding or coil) of the transformer 104 is coupled between a gate terminal 101c of the first input transistor 101 and a gate terminal 102c of the second input transistor 102, and a buffer 105 (e.g. buffer element or buffer circuit) having an input 105a and an output 105b is coupled with its input 105a to a biasing potential VG1 and with its output 105b to the center tap 104c of the secondary 104b (e.g. secondary winding or coil) of the transformer 104. Driving the first and second input transistors 101, 102 includes providing a first input (gate) voltage Vin+ at the gate terminal 101c of the first input transistor 101 and a second input (gate) voltage Vin− at the gate terminal 102c of the second input transistor 102.

Figure 9:
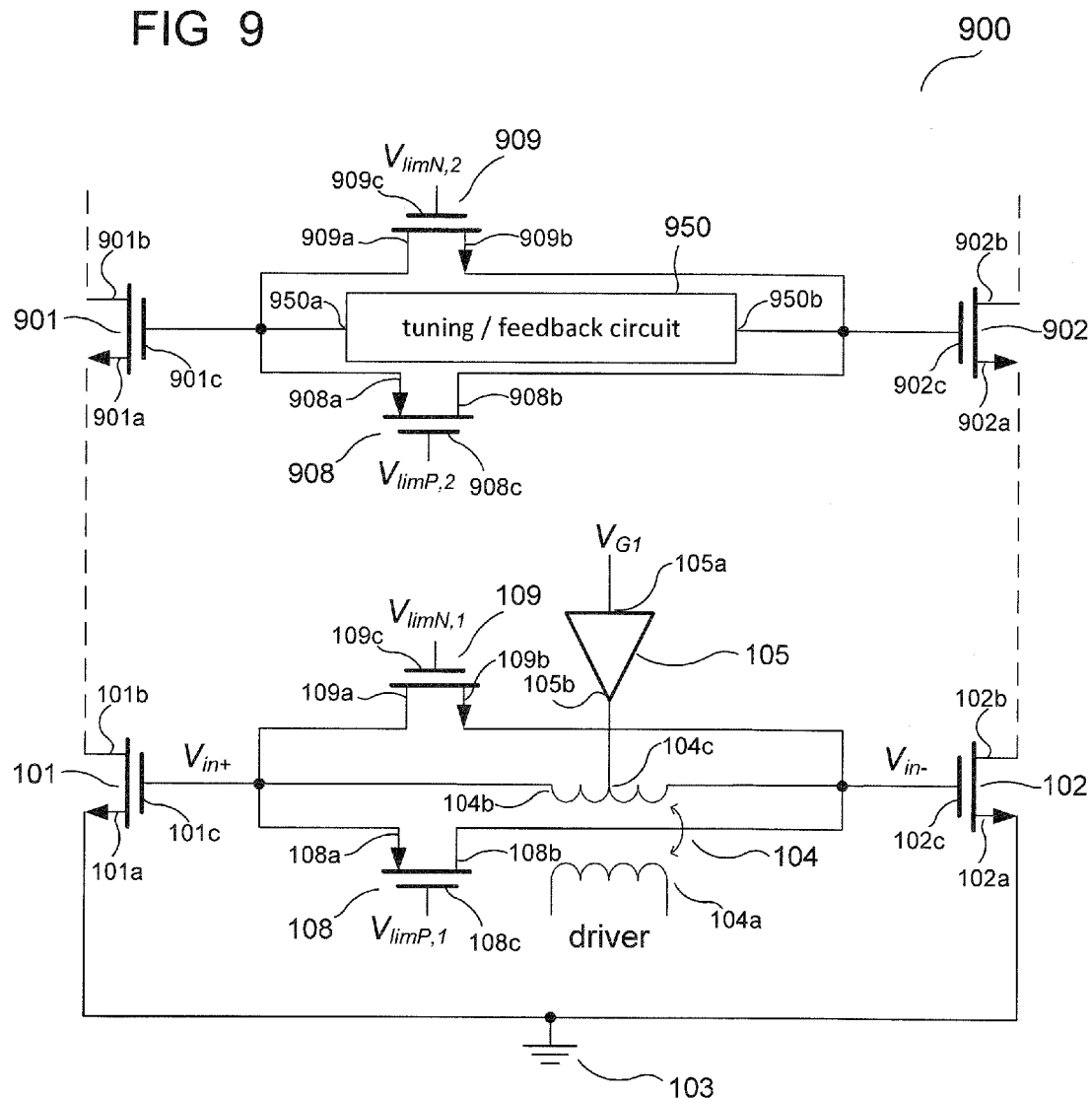
FIG. 9 shows an example of a power amplifier output stage including an amplifier stack with voltage limiting functionality provided at various transistors of the stack.
Figure 11:
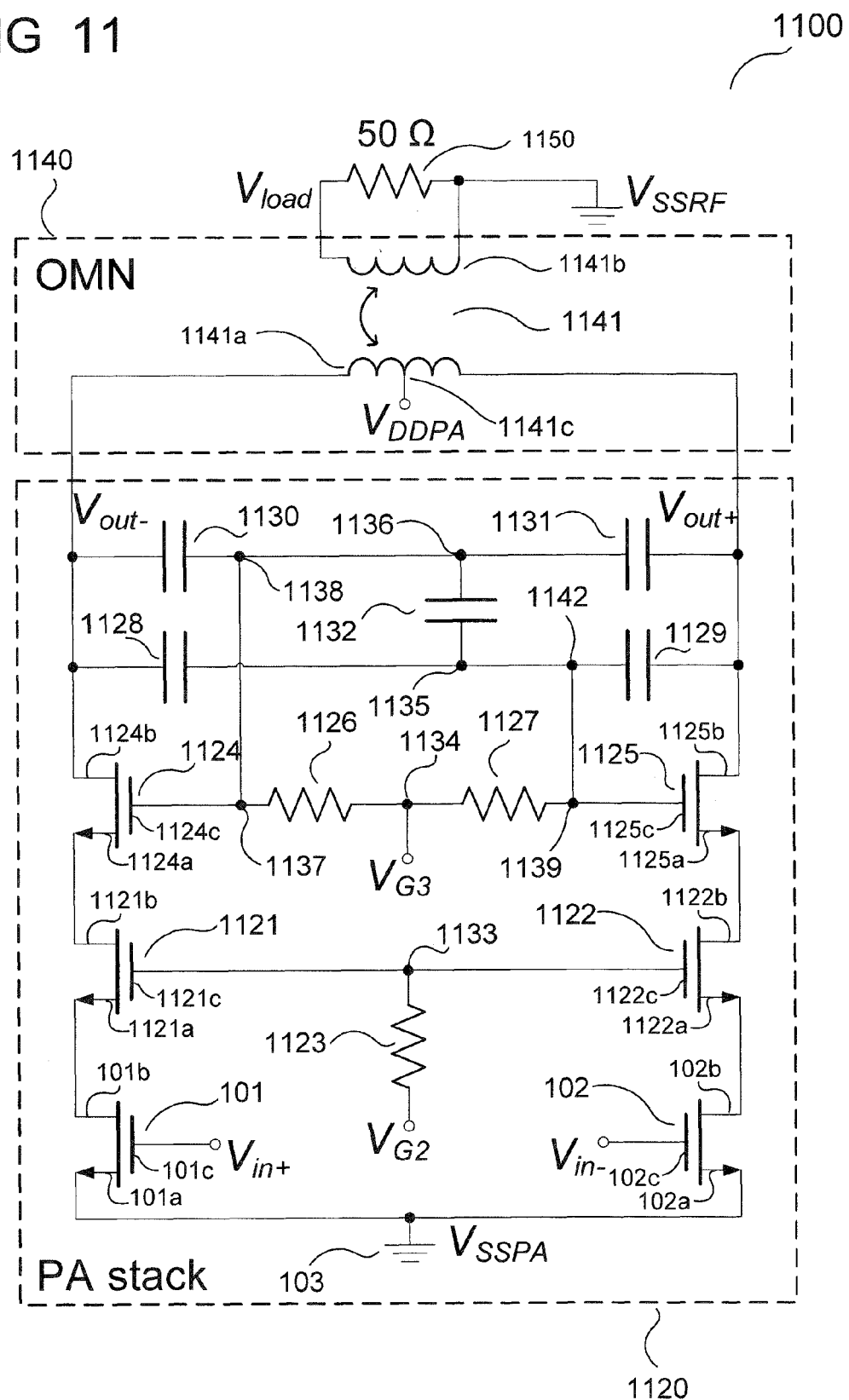
FIG. 11 shows an example of a power amplifier stage that may be used in the example of FIG. 10.

A second source/drain terminal 101b (e.g. drain terminal) of the first input transistor 101 and a second source/drain terminal 102b (e.g. drain terminal) of the second input transistor 102 of the PA output stage may be coupled to one or more additional circuit elements (not shown in FIG. 1, see e.g. FIG. 9 or FIG. 11).

The driving circuit ("driver") may provide a driving signal, for example an RF (radio frequency) driving signal, that may be coupled inductively into the input nodes of the PA output stage by means of the transformer 104.

Figure 2:
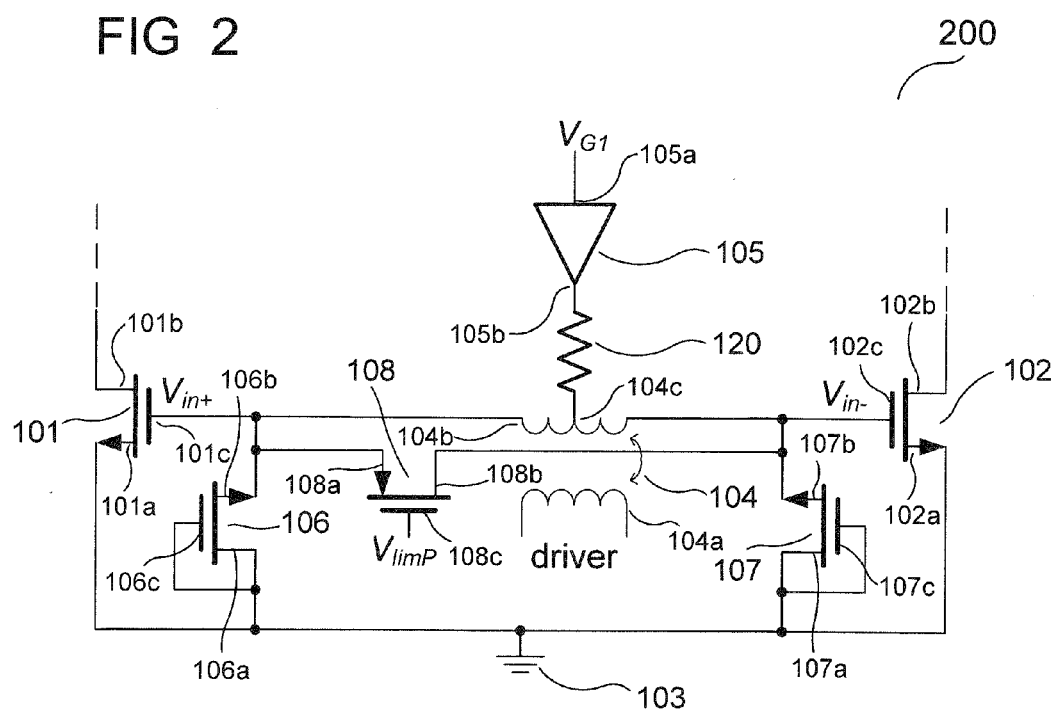
FIG. 2 shows an example of a power amplifier output stage with added dynamic biasing and voltage limiting functionality.

FIG. 2 shows, as a circuit diagram 200, an example of a PA output stage similar to the one shown in FIG. 1, but with additional dynamic biasing and voltage limiting functionality. Reference signs that are the same as in FIG. 1 may denote the same elements as their and will not be described in detail again here for sake of brevity. Reference is made to the description above.

The PA output stage of FIG. 2 includes a first NMOS transistor 106 coupled between the gate terminal 101c of the first input transistor 101 and the lower supply potential 103. More particularly, a first source/drain terminal 106a (e.g. drain terminal) and a gate terminal 106c of the first NMOS transistor 106 are coupled to the lower supply potential 103, and a second source/drain terminal 106b (e.g. source terminal) of the first NMOS transistor 106 is coupled to the gate terminal 101c of the first input transistor 101.

The PA output stage of FIG. 2 further includes a second NMOS transistor 107 coupled between the gate terminal 102c of the second input transistor 102 and the lower supply potential 103. More particularly, a first source/drain terminal 107a (e.g. drain terminal) and a gate terminal 107c of the second NMOS transistor 107 are coupled to the lower supply potential 103, and a second source/drain terminal 107b (e.g. source terminal) of the second NMOS transistor 107 is coupled to the gate terminal 102c of the second input transistor 102.

The added NMOS transistors 106, 107 may clip negative peaks of the input voltage (Vin+ or Vin−) below −VthN (wherein VthN denotes a threshold voltage of the NMOS transistors 106, 107 (VthN>0); the NMOS transistors 106, 107 may be designed to have the same threshold voltage, however it may also be possible that the NMOS transistors 106, 107 have different threshold voltages). That is, the input voltage Vin+ or Vin− at the gate terminals 101c, 102c may not fall below, or may fall only slightly below, −VthN because when Vin+ or Vin− becomes lower than −VthN the respective NMOS transistor 106, 107 will turn on and will provide current from the lower supply potential 103 to the gate terminal 101c/102c of the respective input transistor 101/102 thus increasing again the voltage at the gate terminal 101c/102c. This may provide useful protection function because during the negative peaks of the input (gate) voltage (Vin+ or Vin−), the drain voltage of the input transistors 101, 102 (voltage at the drain terminals 101b, 102b) normally has positive peaks. In this case, the drain-to-gate voltage (voltage between drain terminal 101b/102b and gate terminal 101c/102c of the input transistor 101/102) may be very high which may damage the transistor 101/102 due to overstress of the gate oxide in the gate-drain overlap. The first and second NMOS transistors 106, 107 may also be referred to as first and second clipping transistors, or as (NMOS) clipper.

Furthermore, the added NMOS transistors 106, 107 may also have a dynamic biasing function, which may be useful to increase Psat and sharpen the transition from linear operation to saturation, as will be explained further below.

In another example, only one of the NMOS transistors 106, 107 may be provided, e.g. NMOS transistor 106 or NMOS transistor 107.

The PA output stage may further include a PMOS transistor 108 which may be coupled between the gate terminal 101c of the first input transistor 101 and the gate terminal 102c of the second input transistor 102. More particularly, a first source/drain terminal 108a (e.g. source terminal) of the PMOS transistor 108 may be coupled to the gate terminal 101c of the first input transistor 101, a second source/drain terminal 108b (e.g. drain terminal) of the PMOS transistor 108 may be coupled to the gate terminal 102c of the second input transistor 102, and a gate terminal 108c of the PMOS transistor 108 may be coupled to a biasing potential (herein also referred to as limiter bias voltage) VlimP. The biasing potential (limiter bias voltage) VlimP may, for example, be set or programmed to be in the range from about 1 V to about 1.5 V. However, VlimP may have other values as well.

The added PMOS transistor 108 may clip positive peaks of the input voltage (Vin+ or Vin−) above VlimP−VthP (wherein VthP denotes a threshold voltage of the PMOS transistor 108 (VthP<0)). That is, the input voltage Vin+ or Vin− at the gate terminals 101c, 102c may not rise above, or may rise only slightly above, VlimP−VthP because when Vin+ (or Vin−) becomes higher than VlimP−VthP the PMOS transistor 108 will turn on and will drain current from the gate terminal 101c (or 102c) of the first input transistor 101 (or second input transistor 102) to the gate terminal 102c (or 101c) of the second input transistor 102 (or first input transistor 101) thus decreasing again the voltage at the gate terminal 101c (or 102c) of the first input transistor 101 (or second input transistor 102). This may provide useful protection function because during the positive peaks of the input (gate) voltage (Vin+ or Vin−), the drain voltage of the input transistors 101, 102 (voltage at the drain terminals 101b, 102b) normally has negative peaks. In this case, the gate-to-channel voltage (voltage between gate terminal 101c/102c and a channel region of the input transistor 101/102) may become too high such that the gate oxide of the input transistors 101, 102 may get damaged. The PMOS transistor 108 may also be referred to as third clipping transistor, or as (PMOS) clipper. In another example, the PMOS transistor 108 (PMOS clipper) may be omitted.

The operation of the added NMOS clipper 106, 107 in the circuit of FIG. 2 may be better understood by setting VlimP (biasing potential at the gate terminal 108c of the PMOS transistor 108) to a very high voltage, so that the PMOS transistor 108 is always off.

Figure 3:
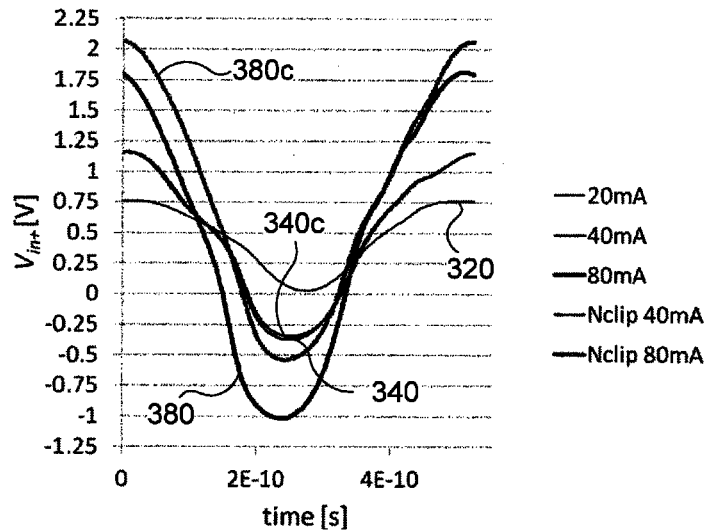
FIG. 3 shows input gate voltages in the circuits of FIG. 1 and FIG. 2 for different driving levels.

FIG. 3 shows, in a diagram 300, the input voltage Vin+ at the gate terminal 101c of the first input transistor 101 of the circuits of FIGS. 1 and 2 versus time, for three different driving levels, namely 20 mA, 40 mA, and 80 mA, wherein the driver in this example is linear and current-mode. A similar diagram may be obtained, and similar considerations as set forth below may apply for the input voltage Vin− at the gate terminal 102c of the second input transistor 102.

A first curve 320 ("20 mA") shows the input voltage Vin+ for the circuit of FIG. 1 (without NMOS clipper) for a driving level of 20 mA, a second curve 340 ("40 mA") shows the input voltage Vin+ for the circuit of FIG. 1 (without NMOS clipper) for a driving level of 40 mA, a third curve 380 ("80 mA") shows the input voltage Vin+ for the circuit of FIG. 1 (without NMOS clipper) for a driving level of 80 mA, a fourth curve 340c ("Nclip 40 mA") shows the input voltage Vin+ for the circuit of FIG. 2 (with NMOS clipper) for the driving level of 40 mA, and a fifth curve 380c ("Nclip 80 mA") shows the input voltage Vin+ for the circuit of FIG. 2 (with NMOS clipper) for the driving level of 80 mA.

At 20 mA, the voltage swing (of Vin+) is so low that the NMOS clipper 106, 107 in the circuit of FIG. 2 is always off and there is no difference between the circuits of FIG. 1 and FIG. 2, thus only one curve is shown in diagram 300 for the driving level of 20 mA, namely first curve 320.

At 40 mA, the negative peak (of Vin+) is close to the clipping value −VthN and there may already be seen a very small effect of the NMOS clipper 106, 107 by comparison of the fourth curve 340c ("Nclip 40 mA") with the second curve 340 ("40 mA").

At 80 mA, the original circuit of FIG. 1 (without clipping) has negative peaks around −1 V. During these peaks, the circuit of FIG. 2 has the NMOS clipper 106, 107 pumping current into the input node, and the peak is limited to about −0.5 V, which is slightly below −VthN, as may be seen by comparison of the fifth curve 380c ("Nclip 80 mA") with the third curve 380 ("80 mA").

Illustratively, the NMOS clipper 106, 107 may limit the negative peaks of the input voltages Vin+ and Vin− at the gate terminals 101c and 102c of the first and second input transistors 101, 102. In other words, the negative peaks of the input voltages Vin+ and Vin− may be smaller in the circuit of FIG. 2 where the NMOS clipper 106, 107 is provided compared to the circuit of FIG. 1 without NMOS clipper.

The current which the NMOS clipper 106, 107 pumps into the input nodes may change the harmonic content of the input voltage Vin+ (Vin−) of the PA output stage. Namely, DC and even-order (in particular, second-order) harmonic components may be added to the input voltage, which may cause not only the clipping of the negative peaks but may also cause an increase of the DC value and the positive peak. Thus, the NMOS clipper 106, 107 may also have a dynamic biasing function. Depending on the output stage that is used, this dynamic biasing may lead to significant increase of Psat and to a sharper transition from linear operation to saturation, as shown in FIG. 4.

Figure 4:
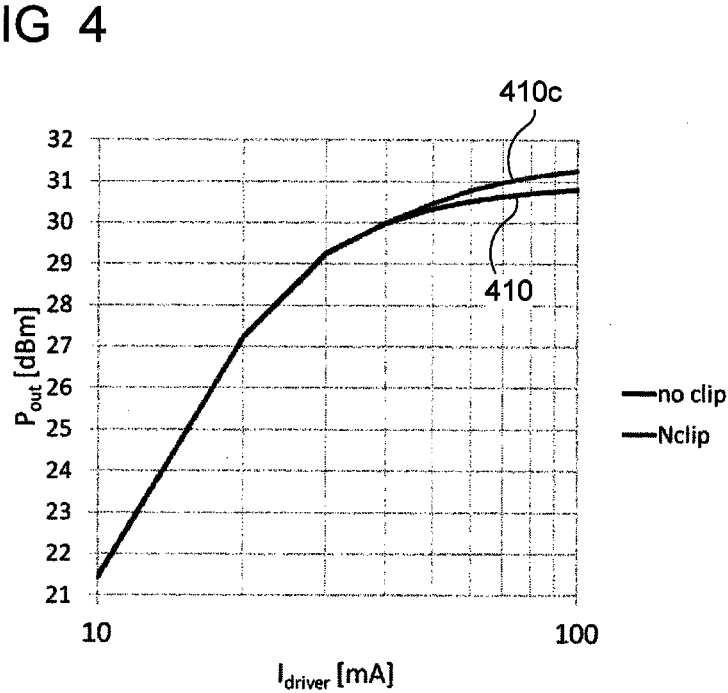
FIG. 4 shows AM/AM characteristics of the circuits of FIG. 1 and FIG. 2.

FIG. 4 shows, in a diagram 400, the AM/AM characteristics of the circuit of FIG. 1 (as a first curve 410 ("no clip")) and of the circuit of FIG. 2 (as a second curve 410c ("Nclip")). More particularly, diagram 400 shows output power ($P_{out}$) versus driving level ($I_{driver}$) for the circuit of FIG. 1 (first curve 410, without clipping) and the circuit of FIG. 2 (second curve 410c, with NMOS clipper, wherein VlimP is very high so that the PMOS clipper 108 is always off). As may be seen from diagram 400, the saturation power (Psat) may be higher in the circuit of FIG. 2 having the NMOS clipper (second curve 410c).

The PA output stage of FIG. 2 may further include an electrical resistance, e.g. a resistor 120 as shown, that is coupled between the output 105b of the buffer 105 and the center tap 104c of the secondary 104b of the transformer 104. The resistor 120 added in FIG. 2 to the output 105b of the VG1 buffer 105 may represent an impedance seen from the center tap 104c of the secondary 104b of the transformer 104 to the VG1 buffer 105. The impedance may be set suitably, taking e.g. into account that zero impedance may hinder the operation of the NMOS clippers 106, 107 and dynamic bias, too low impedance may lead to large sized NMOS clippers 106, 107, and too high impedance may cause memory effects in the PA transfer characteristics. For example, the resistor 120 may have a resistance in the range from about 10 ohms to about 200 ohms, although other values may be possible.

In another example, the resistance (e.g. resistor) 120 may be omitted in the circuit. In this case, it may, for example, be provided that an impedance of the buffer 105 is sufficiently high.

As mentioned above, very high positive peaks of the input voltage Vin+/Vin− may damage the gate oxide of the input transistors 101, 102. Therefore, the biasing potential VlimP at the gate terminal of the PMOS transistor (PMOS clipper) 108 may be set low enough, in order to clip those peaks to a maximum value allowed for reliable operation.

Figure 5:
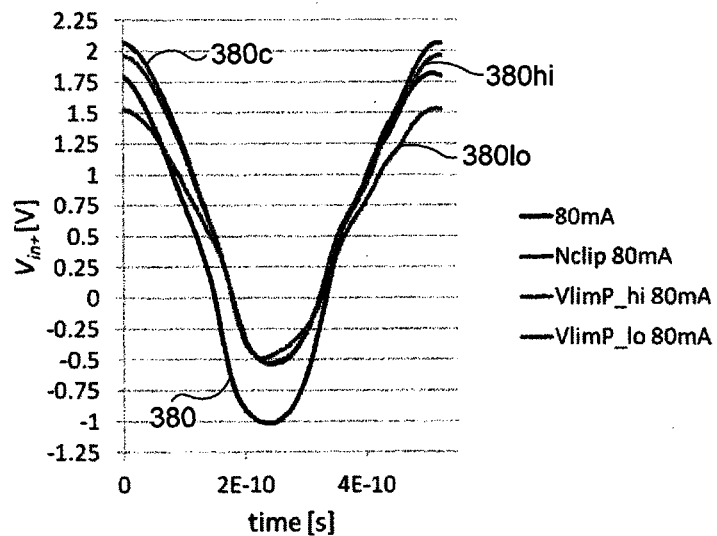
FIG. 5 shows input gate voltages in the circuits of FIG. 1 and FIG. 2, illustrating clipping of both negative peaks and positive peaks in the circuit of FIG. 2.

The effect of the PMOS clipper 108 on the input voltage Vin+ at the gate terminal 101c of the first input transistor 100 is shown in FIG. 5 in a diagram 500 for a driving level of 80 mA and two different values of VlimP. A similar diagram may be obtained, and similar considerations as set forth below may apply for the input voltage Vin− at the gate terminal 102c of the second input transistor 102.

In particular, curves 380 ("80 mA") and 380c ("Nclip 80 mA") in diagram 500 correspond to the respective curves 380 and 380c in diagram 300 of FIG. 3 where, in each case, the PMOS clipper 108 is off ("VlimP very high"), while curves 380hi ("VlimP_hi 80 mA") and 380lo ("VlimP_lo 80 mA") in diagram 500 represent, respectively, a case with a high value of VlimP and a low value of VlimP.

With the lower value of VlimP (curve 380lo), it may be observed not only that the positive peak clips at lower value (e.g. 1.5 V), but also that the negative clipping is more effective. This is because the current that the PMOS clipper 108 pumps out of one input node during its positive peak may be pumped into the other input node while this has a negative voltage peak. That is, the PMOS clipper 108 may act here in parallel with the NMOS clipper 106 (or 107).

For example, when the input node at the gate terminal 101c of the first input transistor 101 has a negative peak of its input voltage Vin+, the input node at the gate terminal 102c of the second input transistor 102 may have a positive peak of its input voltage Vin−. In this case, the NMOS clipper 106 coupled to the gate terminal 101c of the first input transistor 101 may pump current into the input node at the gate terminal 101c of the first input transistor 101, and at the same time the PMOS clipper 108 may pump out current from the input node at the gate terminal 102c of the second input transistor 102 and pump the current into the input node at the gate terminal 101c of the first input transistor 101. That is, the NMOS clipper 106 and the PMOS clipper 108 may both pump current into the input node at the gate terminal 101c of the first input transistor 101 and thus increase the input voltage Vin+ at the gate terminal 101c of the first input transistor 101.

Figure 6:
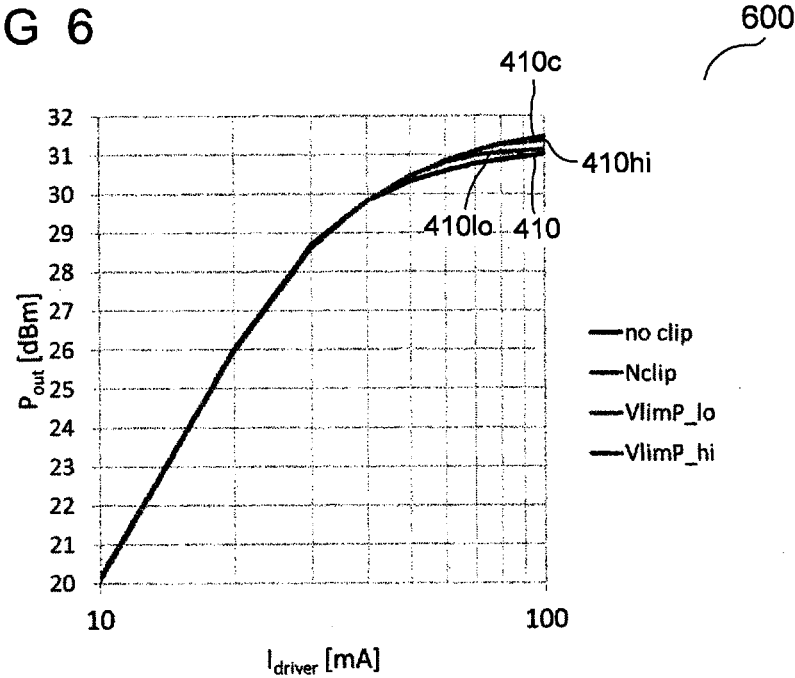
FIG. 6 shows AM/AM characteristics of the circuits of FIG. 1 and FIG. 2, illustrating the effect of negative peak and positive peak clipping on the AM/AM characteristic in the circuit of FIG. 2.

The effect of both clippers (i.e. NMOS clipper 106, 107 and PMOS clipper 108) on the AM/AM characteristic of the PA is shown in FIG. 6 in a diagram 600.

In the diagram 600, curves 410 ("no clip") and 410c ("Nclip") correspond to the respective curves 410 and 410c in diagram 400 of FIG. 4 and illustrate the AM/AM characteristics of the circuits of FIG. 1 and FIG. 2 with the PMOS clipper being "off", while curves 410lo ("VlimP_lo") and 410hi ("VlimP_hi") in diagram 600 represent, respectively, the case with a low value of VlimP and a high value of VlimP.

As may be seen, the saturation power (Psat) for the two cases with PMOS clipping (curves 410lo and 410hi) may be between the two cases without PMOS clipping (curves 410 and 410c in FIG. 6). Furthermore, the transition from linear operation to saturation may become sharper with PMOS clipping.

In another example, the gate terminals 106c, 107c of the NMOS clipper transistors 106, 107 may be connected to another potential than the lower supply (e.g. VSS or ground) potential 103, in order to enable clipping and dynamic biasing at other values. For example, the gate terminal 106c of the first NMOS transistors 106 and/or the gate terminal 107c of the second NMOS transistor 107 may be coupled to a biasing potential VclipN which may be different from the lower supply potential 103. In this case, the first NMOS transistor 106 and/or the second NMOS transistor 107 may clip negative peaks of the input voltage (Vin+ or Vin−) below VclipN−VthN.

In still another example, also the first source/drain terminals 106a, 106b (e.g. source/drain diffusions) of the NMOS clipper transistors 106, 107, which are connected to the lower supply potential (e.g. VSS or ground) 103 in FIG. 2, may be connected to another potential.

In yet another example, it may also be possible to couple a PMOS clipper transistor between the respective input node (or gate terminal of the respective input transistor 101, 102) and an upper power supply potential (e.g. VDD) to clip positive peaks of the input voltage Vin+/Vin−. For example, a first PMOS clipper transistor may be provided having a first source/drain terminal coupled to the gate terminal 101c of the first input transistor 101, and a second source/drain terminal and gate terminal coupled to the upper power supply potential, to clip positive peaks of the input voltage Vin+ at the gate terminal 101c of the first input transistor 101, and/or a second PMOS clipper transistor may be provided having a first source/drain terminal coupled to the gate terminal 102c of the second input transistor 102, and a second source/drain terminal and gate terminal coupled to the upper power supply potential, to clip positive peaks of the input voltage Vin− at the gate terminal 102c of the second input transistor 102. The PMOS clipper transistor(s) may be provided as an alternative or in addition to the PMOS clipper 108.

Figure 7:
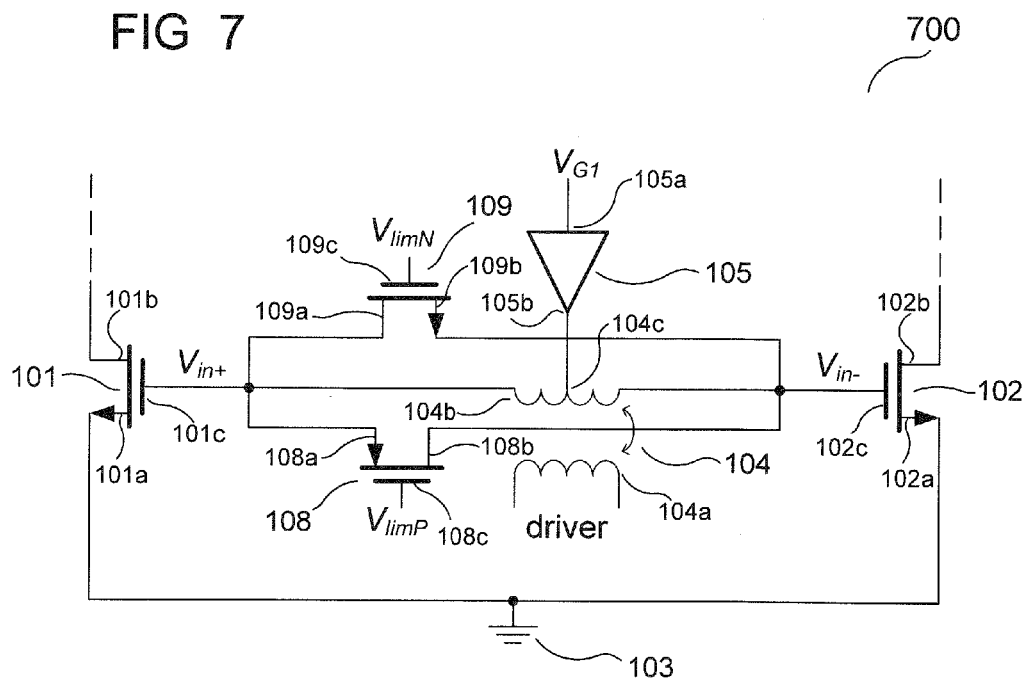
FIG. 7 shows an example of a power amplifier output stage with voltage limiting functionality.

An alternative configuration to the circuit of FIG. 2 is shown in FIG. 7.

FIG. 7 shows, as a circuit diagram 700, an example of a PA output stage with voltage limiting functionality but without dynamic biasing. The PA output stage is to some degree similar to the PA output stage of FIG. 2. References signs that are the same as in FIG. 2 may denote the same elements as there and will not be described in detail again here for sake of brevity. Reference is made to the description above.

The PA output stage of FIG. 7 differs from the one of FIG. 2 in that the first and second NMOS transistors 106, 107 are replaced by a single NMOS transistor 109 coupled between the gate terminal 101c of the first input transistor 101 and the gate terminal 102c of the second input transistor 102. More particularly, a first source/drain terminal 109a (e.g. source terminal) of the NMOS transistor 109 may be coupled to the gate terminal 101c of the first input transistor 101, a second source/drain terminal 109b (e.g. drain terminal) of the NMOS transistor 109 may be coupled to the gate terminal 102c of the second input transistor 102, and a gate terminal 109c of the NMOS transistor 109 may be coupled to a biasing potential (limiter bias voltage) VlimN, as shown in FIG. 7. The NMOS transistor 109 may clip negative peaks of the input voltage (Vin+ or Vin−) below VlimN−VthN (wherein VthN denotes a threshold voltage of the NMOS transistor 109). Thus, the NMOS transistor 109 may also be referred to as NMOS clipper. Illustratively, the operation of the NMOS clipper 109 may be equivalent (symmetrical) to that of the PMOS clipper 108. The biasing potential (limiter bias voltage) VlimN may, for example, be set or programmed to be in the range from about −0.5 V to about 1 V, but can also assume other voltage values.

In the PA output stage of FIG. 7, the dynamic biasing function may be missing (because both the PMOS transistor (clipper) 108 and the NMOS transistor (clipper) 109 are floating) but its effect may, for example, be at least partially replaced by making the input signal VG1 of the buffer 105 vary with the instantaneous value of the envelope of the signal. This may add some complexity to the generation of VG1, but the resistance at the output 105b of the VG1 buffer 105 may be zero (indicated by the missing resistance 120 at the buffer output 105b in FIG. 7, compare FIG. 2). Thus, the aforementioned trade-off between a low impedance to reduce memory effects and a high impedance to ease the NMOS clipper design may not be relevant anymore. This may, for example, be an advantage in RF (radio frequency) applications, e.g. mobile radio communication applications, if the ratio of the RF to a baseband signal frequency is relatively low.

It should be noted that limiting of both the positive and negative peaks of the input voltage Vin+/Vin− may also be achieved by using only the PMOS clipper 108 or only the NMOS clipper 109 of FIG. 7. In other words, only the PMOS clipper 108 or only the NMOS clipper 109 may be provided in the circuit. However, only one limiting value may be directly set and therefore most accurate in this case: the positive (=VlimP+VthP), if using the PMOS clipper 108, or the negative (=VlimN−VthN), if using the NMOS clipper 109; the other limit also depends on the DC value (and on the harmonic content) of the input voltage Vin+/Vin−.

Figure 8:
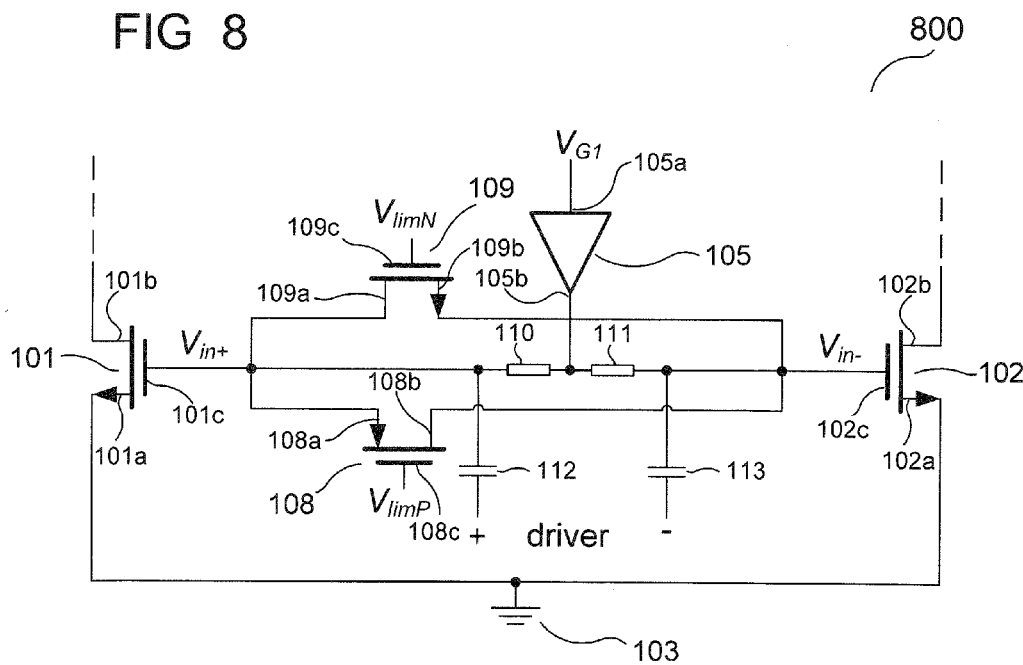
FIG. 8 shows an example of a power amplifier output stage with voltage limiting functionality and capacitive coupling of a driving signal into input nodes of the stage.

FIG. 8 shows, as a circuit diagram 800, another example of a PA output stage with voltage limiting functionality but without dynamic biasing. The PA output stage is to some degree similar to the PA output stage of FIG. 7. References signs that are the same as in FIG. 7 may denote the same elements as there and will not be described in detail again here for sake of brevity. Reference is made to the description above.

The PA output stage of FIG. 8 differs from the PA output stage of FIG. 7 in that the driving signal provided by the driving circuit ("driver") may be capacitively coupled into the input nodes of the output stage. More particularly, the transformer 104 of the PA output stage of FIG. 7 is replaced by a capacitive coupling circuit including a first resistance (e.g. resistor) 110, e.g. a first bias resistor (alternatively, any device providing a certain impedance and a DC path), coupled between the output 105b of the buffer 105 and the gate terminal 101c of the first input transistor 101, a second resistance (e.g. resistor) 111, e.g. a second bias resistor (alternatively, any device providing a certain impedance and a DC path), coupled between the output 105b of the buffer 105 and the gate terminal 102c of the second input transistor 102, a first capacitance (e.g. capacitor) 112 coupled with its one end between the first resistance (e.g. resistor) 110 and the gate terminal 101c of the first input transistor 101 and with its other end to a first signal output ("+") of the driving circuit ("driver"), and a second capacitance (e.g. capacitor) 113 coupled with its one end between the second resistance (e.g. resistor) 111 and the gate terminal 102c of the second input transistor 102 and with its other end to a second signal output ("−") of the driving circuit ("driver").

It will be readily understood that the capacitive coupling of the driving signal into the input nodes, as shown in FIG. 8, may also be implemented with the other examples described herein.

FIG. 9 shows, as a circuit diagram 900, an example of a PA output stage including a transistor stack including the first and second input transistors 101, 102 with added voltage limiting functionality provided by the PMOS clipper 108 and NMOS clipper 109 as in FIG. 7, and further including additional NMOS transistors 901, 902 coupled to the input transistors 101, 102 and also provided with voltage limiting functionality provided by a second PMOS clipper 908 and a second NMOS clipper 909, as will be described below. References signs that are the same as in FIG. 7 may denote the same elements as there and will not be described in detail again here for sake of brevity. Reference is made to the description above. It should be noted that the biasing potential VlimP,1 in FIG. 9 may correspond to the biasing potential VlimP in FIG. 7, and the biasing potential VlimN,1 in FIG. 9 may correspond to the biasing potential VlimN in FIG. 7.

In the PA output stage of FIG. 9 an NMOS transistor 901 having a first source/drain terminal (e.g. source terminal) 901a, a second source/drain terminal (e.g. drain terminal) 901b, and a gate terminal 901c, is coupled with its first source/drain terminal 901a to the second source/drain terminal 101b of the first input transistor 101. Similarly, an NMOS transistor 902 having a first source/drain terminal (e.g. source terminal) 902a, a second source/drain terminal (e.g. drain terminal) 902b, and a gate terminal 902c, is coupled with its first source/drain terminal 902a to the second source/drain terminal 102b of the second input transistor 102.

A tuning and/or feedback circuit 950 is coupled between the gate terminal 901c of the NMOS transistor 901 and the gate terminal 902c of the NMOS transistor 902. More particularly, a first input/output terminal 950a of the tuning and/or feedback circuit 950 is coupled to the gate terminal 901c of the NMOS transistor 901 and a second input/output terminal 950b of the tuning and/or feedback circuit 950 is coupled to the gate terminal 902c of the NMOS transistor 902. The tuning and/or feedback circuit 950 may be configured to enable proper voltage swings.

A PMOS transistor 908 (second PMOS clipper) may be coupled between the gate terminal 901c of the NMOS transistor 901 and the gate terminal 902c of the NMOS transistor 902. More particularly, a first source/drain terminal 908a (e.g. source terminal) of the PMOS transistor 908 may be coupled to the gate terminal 901c of the NMOS transistor 901, a second source/drain terminal 908b (e.g. drain terminal) of the PMOS transistor 908 may be coupled to the gate terminal 902c of the NMOS transistor 902, and a gate terminal 908c of the PMOS transistor 908 may be coupled to a biasing potential VlimP,2, as shown in FIG. 9.

In addition, an NMOS transistor 909 (second NMOS clipper) may be coupled between the gate terminal 901c of the NMOS transistor 901 and the gate terminal 902c of the NMOS transistor 902. More particularly, a first source/drain terminal 909a (e.g. source terminal) of the NMOS transistor 909 may be coupled to the gate terminal 901c of the NMOS transistor 901, a second source/drain terminal 909b (e.g. drain terminal) of the NMOS transistor 909 may be coupled to the gate terminal 902c of the NMOS transistor 902, and a gate terminal 909c of the NMOS transistor 909 may be coupled to a biasing potential VlimN,2, as shown in FIG. 9.

The PMOS transistor (second PMOS clipper) 908 and the NMOS transistor (second NMOS clipper) 909 may provide a similar voltage limiting functionality for the NMOS transistors 901 and 902 as the PMOS clipper 108 and NMOS clipper 109 do for the input transistors 101 and 102.

FIG. 9 illustrates that the voltage limiting concept of the present disclosure may be applied to any transistor in an amplifier stack, in general.

Figure 10:
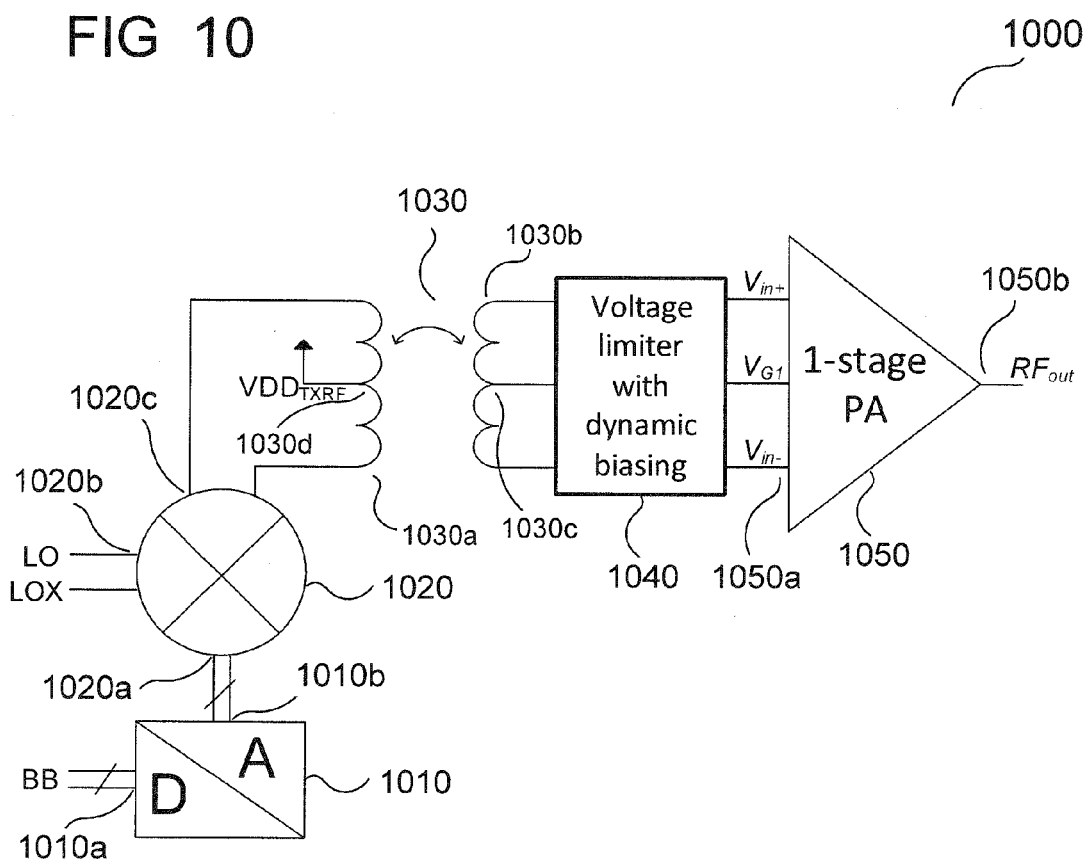
FIG. 10 shows an implementation example of a voltage limiter with dynamic biasing applied to a one-stage power amplifier.

FIG. 10 shows, as a block diagram 1000, an implementation example for a voltage limiter 1040 with dynamic biasing, applied to a power amplifier 1050.

The power amplifier 1050 has only one stage, the output stage, which may be driven by an RFDAC (radio frequency digital-to-analog converter) 1010 with mixer 1020, through a transformer 1030. More particularly, a (digital) base band signal BB may be provided at an input 1010a of the DAC 1010 and the DAC 1010 may convert the base band signal into an analog signal and may provide the analog signal an output 1010b of the DAC 1010. The output 1010b of the DAC 1010 may be coupled to a first input 1020a of the mixer 1020. Thus, the analog signal of the DAC 1010 may be received at the first input 1020a of the mixer 1020. The mixer 1020 may include a second input 1020b and may receive an oscillator signal LO/LOX at the second input 1020b. The mixer 1020 may modulate the analog signal provided by the DAC 1010 using the oscillator signal LO/LOX and may provide a modulated analog RF signal at an output 1020c of the mixer 1020. The RFDAC 1010 with mixer 1020 may have current output and may, for example, be highly linear up to over 100 mA output current.

The output 1020c of the mixer 1020 may be coupled to the transformer 1030, more particularly to a primary 1030a (e.g. primary winding or coil) of the transformer 1030. A biasing potential $VDD_{TXRF}$ may be provided at a center tap 1030d of the primary 1030a of the transformer 1030. A secondary 1030b (e.g. secondary winding or coil) of the transformer 1030 may be coupled to the voltage limiter 1040 with dynamic biasing, which may be coupled to the secondary 1030b and an input 1050a of the power amplifier 1050. For example, the secondary 1030b in FIG. 10 may correspond to the secondary 104b in FIG. 2, the voltage limiter 1040 with dynamic biasing in FIG. 10 may include the NMOS clipper 106, 107 and PMOS clipper 108 in FIG. 2, and the biasing potential VG1 coupled to a center tap 1030c of the secondary 1030b in FIG. 10 may correspond to the biasing potential VG1 coupled (via the buffer 105) to the center tap 104c of the secondary 104b in FIG. 2.

The modulated analog RF signal provided at the output 1020c of the mixer 1020 may thus be inductively coupled into the input 1050a of the power amplifier 1050 by means of the transformer 1030, wherein the voltage limiter 1040 with dynamic biasing may limit an input voltage Vin+/Vin− at the input nodes of the input 1050a of the power amplifier 1050 (e.g. at gate terminals of input transistors of the power amplifier 1050) within predeterminable values, e.g. by clipping positive and/or negative peaks of the input voltage Vin+/Vin− as described herein above, and may further achieve dynamic biasing (e.g. upward shifting of the biasing point of the input transistors of the power amplifier 1050). To this end, the voltage limiter 1040 with dynamic biasing may, for example, be configured as shown in FIG. 2.

An example of a PA stage that may be used for the power amplifier 1050 is shown in FIG. 11 as a circuit diagram 1100.

The PA stage may include a stack 1120 of three transistors: the bottom ones (input transistors 101, 102 receiving the input voltage Vin+/Vin− at their gate terminals 101c, 102c) may have thin oxide gates (for example, having an oxide thickness in the range from about 2 nm to about 3 nm, though other values may be possible as well) and thus relatively low robustness to voltage stress, while the middle ones (transistors 1121, 1122) and top ones (transistors 1124, 1125) may have thick oxide gates (i.e. having a thicker oxide thickness than the thin oxide gates, for example an oxide thickness that is about twice the oxide thickness of the thin oxide gates, for example, an oxide thickness in the range from about 5 nm to about 7 nm, though other values may be possible as well).

More particularly, the PA stack 1120 may include the first and second input transistors 101, 102 coupled to the lower power supply potential (VSSPA) 103 in common-source connection, similarly as in FIG. 2, and may additionally include a third (NMOS) transistor 1121 and a fourth (NMOS) transistor 1122 (middle transistors of the stack 1120), wherein a first source/drain terminal 1121a (e.g. source terminal) of the third transistor 1121 is coupled to the second source/drain terminal (e.g. drain terminal) 101b of the first input transistor 101, a first source/drain terminal (e.g. source terminal) 1122a of the fourth transistor 1122 is coupled to the second source/drain terminal (e.g. drain terminal) 102b of the second input transistor 102, and a gate terminal 1121c of the third transistor 1121 and a gate terminal 1122c of the fourth transistor 1122 are coupled to a common node 1133 that is coupled, via a first resistance (e.g. resistor) 1123, to a biasing potential VG2.

Furthermore, the PA stack 1120 may include a fifth (NMOS) transistor 1124 and a sixth (NMOS) transistor 1125 (top transistors of the stack 1120), wherein a first source/drain terminal 1124a (e.g. source terminal) of the fifth transistor 1124 is coupled to a second source/drain terminal (e.g. drain terminal) 1121b of the third transistor 1121, a first source/drain terminal (e.g. source terminal) 1125a of the sixth transistor 1125 is coupled to a second source/drain terminal (e.g. drain terminal) 1122b of the fourth transistor 1122, a gate terminal 1124c of the fifth transistor 1124 is coupled, via a second resistance (e.g. resistor) 1126 to a common node 1134 that is coupled to a biasing potential VG3, and a gate terminal 1125c of the sixth transistor 112 is coupled, via a third resistance (e.g. resistor) 1127, to the common node 1134 that is coupled to the biasing potential VG3.

Furthermore, the PA stack 1120 may include a first capacitance (e.g. capacitor) 1128 and a second capacitance (e.g. capacitor) 1129 coupled in series between a second source/drain terminal (e.g. drain terminal) 1124b of the fifth transistor 1124 and a second source/drain terminal (e.g. drain terminal) 1125b of the sixth transistor 1125.

Furthermore, the PA stack 1120 may include a third capacitance (e.g. capacitor) 1130 and a fourth capacitance (e.g. capacitor) 1131 coupled in series between the second source/drain terminal (e.g. drain terminal) 1124b of the fifth transistor 1124 and the second source/drain terminal (e.g. drain terminal) 1125b of the sixth transistor 1125, parallel to the series connection of the first and second capacitances 1128, 1129.

Furthermore, the PA stack 1120 may include a fifth capacitance (e.g. capacitor) 1132 coupled with its one end to a node 1135 between the first capacitance 1128 and the second capacitance 1129 and with its other end to a node 1136 between the third capacitance 1130 and the fourth capacitance 1131.

Furthermore, a node 1137 between the gate terminal 1124c of the fifth transistor 1124 and the second resistance 1126 is coupled to a node 1138 between the third capacitance 1130 and the fourth capacitance 1131, and a node 1139 between the gate terminal 1125c of the sixth transistor 1125 and the third resistance 1127 is coupled to a node 1142 between the first capacitance 1128 and the second capacitance 1129.

The PA stack 1120 may be coupled to an output matching network (OMN) 1140, as shown in FIG. 11. More particularly, a primary (e.g. primary winding or coil) 1141a of a transformer 1141 of the OMN 1140 may be coupled between the second source/drain terminal 1124b of the fifth transistor 1124 and the second source/drain terminal 1125b of the sixth transistor 1125b of the PA stack 1120, i.e. between the top transistors 1124, 1125 of the PA stack 1120. A center tap 1141c of the primary 1141a may be coupled to an upper supply potential VDDPA. A secondary (e.g. secondary winding or coil) 1141b of the transformer 1141 of the OMN 1140 may be coupled to a matching resistance (e.g. resistor) 1150 (having, for example a value of about 50 ohms as shown, however other values may be possible) and to a lower power supply potential VSSRF.

The voltage limiter 1040 with dynamic biasing of FIG. 10 (e.g. the voltage limiter including the NMOS clipper 106, 107 and PMOS clipper 108 as shown in FIG. 2) may be added at the input of the PA 1120, e.g. at the gate terminals 101c, 102c of the input transistors 101, 102, similarly as shown in FIG. 2. The limiter bias voltage VlimP may, for example, be made programmable between about 1 V and 1.5 V, although other values may be possible as well. The curves shown in FIGS. 5 and 6 above were obtained from simulations using the circuit shown in FIG. 11.

In accordance with one or more aspects, a differential amplifier stage may include: a first transistor having a gate terminal; a second transistor having a gate terminal; a voltage limiting circuit coupled to the gate terminals of the first and second transistors, wherein the voltage limiting circuit limits a gate voltage supplied to at least one of the gate terminals of the first and second transistors.

The voltage limiting circuit may limit a voltage swing of the gate voltage.

The voltage limiting circuit may limit negative peaks of the gate voltage.

The voltage limiting circuit may limit positive peaks of the gate voltage.

The voltage limiting circuit may limit positive and negative peaks of the gate voltage.

The voltage limiting circuit may clip voltages above a predetermined maximum value, e.g. voltages above a maximum tolerable voltage value for the first and second transistors.

The voltage limiting circuit may clip voltages below a predetermined minimum value, e.g. voltages below a minimum tolerable voltage value for the first and second transistors.

The voltage limiting circuit may shift a biasing point of at least one of the first and second transistors. For example, the voltage limiting circuit may shift the biasing point of both transistors.

The voltage limiting circuit may include a first clipping element coupled between the gate terminal of the first transistor and a power supply potential, and a second clipping element coupled between the gate terminal of the second transistor and the power supply potential.

The first clipping element may be a first voltage clipping element.

The second clipping element may be a second voltage clipping element.

The first and second clipping elements may clip negative peaks of the gate voltage supplied to the at least one of the gate terminals of the first and second transistors.

The first and second clipping elements may include or may be unipolar devices.

The first and second clipping elements may include or may be first and second clipping transistors.

The first and second clipping transistors may include or may be n-type field effect transistors, e.g. NMOS field effect transistors, wherein gate terminals of the first and second clipping transistors (e.g. n-type field effect transistors) may be coupled to the power supply potential, and wherein the power supply potential may be a lower power supply potential (e.g. VSS or ground potential).

The first clipping transistor and/or second clipping transistor may be an n-type field effect transistor and may clip voltages that are below (in other words, smaller than) the negative of a threshold voltage (VthN) of the respective clipping transistor, i.e. below −VthN.

The first and second clipping transistors may include or may be p-type field effect transistors, e.g. PMOS field effect transistors, wherein gate terminals of the first and second clipping transistors (e.g. p-type field effect transistors) may be coupled to the power supply potential, and wherein the power supply potential may be an upper power supply potential (e.g. VDD potential).

A first source/drain terminal of the first clipping transistor may be coupled to the gate terminal of the first transistor, and a second source/drain terminal and a gate terminal of the first clipping transistor may be coupled to the power supply potential. A first source/drain terminal of the second clipping transistor may be coupled to the gate terminal of the second transistor, and a second source/drain terminal and a gate terminal of the second clipping transistor may be coupled to the power supply potential.

The voltage limiting circuit may further include a third clipping element coupled between the gate terminal of the first transistor and the gate terminal of the second transistor.

The third clipping element may be a third voltage clipping element.

The third clipping element may clip positive peaks of the gate voltage supplied to the at least one of the gate terminals of the first and second transistors.

The third clipping element may include or may be an unipolar device.

The third clipping element may include or may be a third clipping transistor.

The third clipping transistor may include or may be a p-type field effect transistor, e.g. a PMOS field effect transistor.

A first source/drain terminal of the third clipping transistor (e.g. p-type field effect transistor) may be coupled to the gate terminal of the first transistor, a second source/drain terminal of the third clipping transistor (e.g. p-type field effect transistor) may be coupled to the gate terminal of the second transistor, and a gate terminal of the third clipping transistor (e.g. p-type field effect transistor) may be coupled to a limiter bias voltage (VlimP).

The limiter bias voltage may be a voltage in the range from about 1 V to about 1.5 V The third clipping transistor may include or may be a p-type field effect transistor and may clip voltages that are above the difference between the limiter bias voltage (VlimP) and a threshold voltage (VthP) of the p-type field effect transistor, i.e. above VlimP−VthP.

The voltage limiting circuit may further include a fourth clipping element coupled between the gate terminal of the first transistor and the gate terminal of the second transistor.

The fourth clipping element may be a fourth voltage clipping element.

The fourth clipping element may clip negative peaks of the gate voltage supplied to the at least one of the gate terminals of the first and second transistors.

The fourth clipping element may include or may be an unipolar device.

The fourth clipping element may include or may be a fourth clipping transistor.

The fourth clipping transistor may include or may be an n-type field effect transistor, e.g. an NMOS field effect transistor.

A first source/drain terminal of the fourth clipping transistor (e.g. n-type field effect transistor) may be coupled to the gate terminal of the first transistor, a second source/drain terminal of the fourth clipping transistor (e.g. n-type field effect transistor) may be coupled to the gate terminal of the second transistor, and a gate terminal of the fourth clipping transistor (e.g. n-type field effect transistor) may be coupled to a limiter bias voltage.

The limiter bias voltage may be a voltage in the range from about −0.5 V to about 1 V but can also assume other voltage values.

The fourth clipping transistor may include or may be an n-type field effect transistor and may clip voltages that are below the difference between the limiter bias voltage (VlimN) and a threshold voltage (VthN) of the n-type field effect transistor, i.e. below VlimN−VthN.

The voltage limiting circuit may include at least one clipping element coupled between the gate terminal of the first transistor and the gate terminal of the second transistor.

The at least one clipping element may be a voltage clipping element.

The at least one clipping element may clip positive peaks of the gate voltage supplied to the at least one of the gate terminals of the first and second transistors.

The at least one clipping element may include or may be an unipolar device.

The at least one clipping element may include or may be at least one clipping transistor.

The at least one clipping transistor may include or may be a p-type field effect transistor, e.g. a PMOS field effect transistor.

A first source/drain terminal of the p-type field effect transistor may be coupled to the gate terminal of the first transistor, a second source/drain terminal of the p-type field effect transistor may be coupled to the gate terminal of the second transistor, and a gate terminal of the p-type field effect transistor may be coupled to a limiter bias voltage.

The limiter bias voltage may be a voltage in the range from about 1 V to about 1.5 V The at least one clipping transistor may include or may be a p-type field effect transistor and may clip voltages that are above the difference between the limiter bias voltage (VlimP) and a threshold voltage (VthP) of the p-type field effect transistor, i.e. above VlimP−VthP.

The at least one clipping transistor may clip negative peaks of the gate voltage supplied to the at least one of the gate terminals of the first and second transistors.

The at least one clipping transistor may include or may be an n-type field effect transistor, e.g. an NMOS field effect transistor.

A first source/drain terminal of the n-type field effect transistor may be coupled to the gate terminal of the first transistor, a second source/drain terminal of the n-type field effect transistor may be coupled to the gate terminal of the second transistor, and a gate terminal of the n-type field effect transistor may be coupled to a limiter bias voltage.

The limiter bias voltage may be a voltage in the range from about −0.5 V to about 1 V but can also assume other voltage values.

The at least one clipping transistor may include or may be an n-type field effect transistor and may clip voltages that are below the difference between the limiter bias voltage (VlimN) and a threshold voltage (VthN) of the n-type field effect transistor, i.e. below VlimN−VthN.

The voltage limiting circuit may provide a dynamic biasing function.

The first and second transistors may be input transistors of the differential amplifier stage.

The first and second transistors may be field effect transistors, e.g. n-type field effect transistors, e.g. NMOS field effect transistors.

The first and second transistors may be coupled in common-source connection.

The first and second transistors may be thin oxide transistors.

The first and second transistors may have a gate oxide thickness in the range from about 2 nm to about 3 nm.

The gate terminals of the first and second transistors may be coupled to a driving circuit, wherein the gate voltage supplied to the at least one of the gate terminals may correspond to a driving signal generated by the driving circuit.

The driving signal may be an RF driving signal.

The driving circuit may be a linear driving circuit.

The driving circuit may be a current-mode driving circuit.

The driving circuit may be inductively coupled to the gate terminals of the first and second transistors.

The driving circuit may include a transformer, wherein a secondary of the transformer may be coupled between the gate terminal of the first transistor and the gate terminal of the second transistor.

The amplifier stage may further include a buffer that may be coupled between a biasing potential and a center tap of the secondary of the transformer.

An input of the buffer may be coupled to the biasing potential, and an output of the buffer may be coupled to the center tap of the secondary of the transformer.

The amplifier stage may further include a resistance (e.g. a resistor) coupled between the buffer and the center tap of the secondary of the transformer. The resistance (e.g. resistor) may be coupled between the output of the buffer and the center tap of the secondary of the transformer. A first terminal of the resistor may be coupled to the output of the buffer, and a second terminal of the resistor may be coupled to the secondary of the transformer.

The driving circuit may be capacitively coupled to the gate terminals of the first and second transistors.

The amplifier stage may further include a tuning and/or feedback circuit that may be coupled between the gate terminal of the first transistor and the gate terminal of the second transistor.

The amplifier stage may be configured as a power amplifier stage, for example as a power amplifier output stage, e.g. as a CMOS power amplifier output stage.

In accordance with one or more aspects, an amplifier stage may include: a transistor having a gate terminal; a voltage limiting circuit coupled to the gate terminal of the transistor, wherein the voltage limiting circuit limits a gate voltage supplied to the gate terminal of the transistor.

The transistor may be an input transistor of the amplifier stage. The gate voltage may be an input voltage. The input voltage may correspond to a driving signal provided by a driving circuit coupled to the input transistor.

The voltage limiting circuit may clip negative peaks and/or negative peaks of the gate voltage.

The voltage limiting circuit may provide a dynamic biasing function.

In accordance with one or more aspects, an amplifier may include an amplifier stage (e.g. differential amplifier stage) in accordance with one or more aspects described herein.

In accordance with one or more aspects, a differential amplifier may include: a first transistor having a gate terminal; a second transistor having a gate terminal; a voltage limiting circuit coupled to the gate terminals of the first and second transistors, wherein the voltage limiting circuit limits a gate voltage supplied to at least one of the gate terminals of the first and second transistors.

The first and second transistors may be input transistors of the amplifier.

The amplifier may include a transistor stack, wherein the transistor stack may include the first and second transistors, wherein the transistor stack may further include at least one additional transistor coupled in series to the first transistor and at least one additional transistor coupled in series to the second transistor.

The amplifier may be configured as a power amplifier, for example as a CMOS power amplifier.

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A differential amplifier stage, comprising:
a first transistor comprising a gate terminal;
a second transistor comprising a gate terminal;
a voltage limiting circuit coupled to the gate terminals of the first and second transistors,
wherein the voltage limiting circuit limits a gate voltage supplied to at least one of the gate terminals of the first and second transistors,
wherein the voltage limiting circuit comprises a first clipping element coupled between the gate terminal of the first transistor and a power supply potential, and a second clipping element coupled between the gate terminal of the second transistor and the power supply potential, and
wherein the first and second clipping elements comprise first and second clipping transistors.

2. The amplifier stage of claim 1, wherein the voltage limiting circuit limits negative peaks of the gate voltage.

3. The amplifier stage of claim 1, wherein the voltage limiting circuit limits positive peaks of the gate voltage.

4. The amplifier stage of claim 1, wherein the voltage limiting circuit limits positive and negative peaks of the gate voltage.

5. The amplifier stage of claim 1, wherein the voltage limiting circuit shifts a biasing point of at least one of the first and second transistors.

6. The amplifier stage of claim 1, wherein the first and second clipping elements clip negative peaks of the gate voltage supplied to the at least one of the gate terminals of the first and second transistors.

7. The amplifier stage of claim 1, wherein the first and second clipping transistors comprise n-type field effect transistors.

8. The amplifier stage of claim 7, wherein gate terminals of the n-type field effect transistors are coupled to the power supply potential.

9. The amplifier stage of claim 8, wherein the power supply potential is a lower power supply potential.

10. The amplifier stage of claim 1, wherein the voltage limiting circuit further comprises a third clipping element coupled between the gate terminals of the first and second transistors.

11. The amplifier stage of claim 10, wherein the third clipping element clips positive peaks of the gate voltage supplied to the at least one of the gate terminals of the first and second transistors.

12. The amplifier stage of claim 10, wherein the third clipping element comprises a third clipping transistor.

13. The amplifier stage of claim 12, wherein the third clipping transistor comprises a p-type field effect transistor.

14. The amplifier stage of claim 13,
wherein a first source/drain terminal of the p-type field effect transistor is coupled to the gate terminal of the first transistor,
wherein a second source/drain terminal of the p-type field effect transistor is coupled to the gate terminal of the second transistor, and
wherein a gate terminal of the p-type field effect transistor is coupled to a limiter bias voltage.

15. The amplifier stage of claim 1, wherein the voltage limiting circuit comprises at least one clipping element coupled between the gate terminals of the first and second transistors.

16. The amplifier stage of claim 15, wherein the at least one clipping element clips positive peaks of the gate voltage supplied to the at least one of the gate terminals of the first and second transistors.

17. The amplifier stage of claim 16, wherein the at least one clipping element comprises a p-type field effect transistor,
wherein a first source/drain terminal of the p-type field effect transistor is coupled to the gate terminal of the first transistor,
wherein a second source/drain terminal of the p-type field effect transistor is coupled to the gate terminal of the second transistor, and
wherein a gate terminal of the p-type field effect transistor is coupled to a limiter bias voltage.

18. The amplifier stage of claim 15, wherein the at least one clipping element clips negative peaks of the gate voltage supplied to the at least one of the gate terminals of the first and second transistors.

19. The amplifier stage of claim 18, wherein the at least one clipping element comprises an n-type field effect transistor,
wherein a first source/drain terminal of the n-type field effect transistor is coupled to the gate terminal of the first transistor,
wherein a second source/drain terminal of the n-type field effect transistor is coupled to the gate terminal of the second transistor, and
wherein a gate terminal of the n-type field effect transistor is coupled to a limiter bias voltage.

20. The amplifier stage of claim 1, wherein the first and second transistors are input transistors of the differential amplifier stage.

21. The amplifier stage of claim 1, wherein the first and second transistors are thin oxide transistors.

22. The amplifier stage of claim 1, wherein the gate terminals of the first and second transistors are coupled to a driving circuit, wherein the gate voltage supplied to the at least one of the gate terminals corresponds to a driving signal generated by the driving circuit.

23. The amplifier stage of claim 22, wherein the driving circuit comprises a transformer, wherein a secondary of the transformer is coupled between the gate terminal of the first transistor and the gate terminal of the second transistor.

24. The amplifier stage of claim 23, further comprising a buffer coupled between a biasing potential and a center tap of the secondary of the transformer.

25. The amplifier stage of claim 24, further comprising a resistance coupled between the buffer and the center tap of the secondary of the transformer.

26. The amplifier stage of claim 1, wherein the amplifier stage is configured as a power amplifier stage.

27. A differential amplifier stage, comprising:
a first transistor comprising a gate terminal;
a second transistor comprising a gate terminal;
a voltage limiting circuit coupled to the gate terminals of the first and second transistors,
wherein the voltage limiting circuit limits a gate voltage supplied to at least one of the gate terminals of the first and second transistors,
wherein the gate terminals of the first and second transistors are coupled to a driving circuit, wherein the gate voltage supplied to the at least one of the gate terminals corresponds to a driving signal generated by the driving circuit, and
wherein the driving circuit comprises a transformer, wherein a secondary of the transformer is coupled between the gate terminal of the first transistor and the gate terminal of the second transistor.

* * * * *